(12) United States Patent
Kagawa

(10) Patent No.: US 11,875,991 B2
(45) Date of Patent: Jan. 16, 2024

(54) SUBSTRATE TREATMENT METHOD AND SUBSTRATE TREATMENT DEVICE

(71) Applicant: Tokyo Electron Limited, Tokyo (JP)

(72) Inventor: Koji Kagawa, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 292 days.

(21) Appl. No.: 16/973,554

(22) PCT Filed: Jun. 4, 2019

(86) PCT No.: PCT/JP2019/022225
§ 371 (c)(1),
(2) Date: Dec. 9, 2020

(87) PCT Pub. No.: WO2019/239970
PCT Pub. Date: Dec. 19, 2019

(65) Prior Publication Data
US 2021/0257209 A1    Aug. 19, 2021

(30) Foreign Application Priority Data

Jun. 13, 2018    (JP) .................................. 2018-112512

(51) Int. Cl.
| | |
|---|---|
| H01L 21/02 | (2006.01) |
| B08B 3/08 | (2006.01) |
| C23F 1/26 | (2006.01) |
| H01L 21/67 | (2006.01) |
| H01L 21/687 | (2006.01) |

(52) U.S. Cl.
CPC .......... *H01L 21/02057* (2013.01); *B08B 3/08* (2013.01); *C23F 1/26* (2013.01); *H01L 21/67051* (2013.01); *H01L 21/68764* (2013.01)

(58) Field of Classification Search
None
See application file for complete search history.

(56) References Cited

U.S. PATENT DOCUMENTS

| | | | |
|---|---|---|---|
| 8,747,689 B2* | 6/2014 | Ohno | H01L 21/31111 438/689 |
| 9,513,556 B2* | 12/2016 | Brown | G03F 7/422 |
| 2014/0141616 A1* | 5/2014 | Bae | H01L 21/32134 438/694 |

(Continued)

FOREIGN PATENT DOCUMENTS

| | | |
|---|---|---|
| JP | 2007-186746 A | 7/2007 |
| JP | 2008-71799 A | 3/2008 |

(Continued)

OTHER PUBLICATIONS

Translation of KR100906043 by Seongho Jang, published Jul. 3, 2009.*

*Primary Examiner* — Mikhail Kornakov
*Assistant Examiner* — Ryan L Coleman
(74) *Attorney, Agent, or Firm* — Nath, Goldberg & Meyer; Jerald L. Meyer; Tanya E. Harkins

(57) ABSTRACT

A substrate treatment method according to an embodiment of the present disclosure includes a temperature raising step of raising a temperature of a concentrated sulfuric acid, and a liquid supply step of supplying the concentrated sulfuric acid having the raised temperature to a substrate placed on a substrate processing part.

7 Claims, 10 Drawing Sheets

(56) References Cited

U.S. PATENT DOCUMENTS

2019/0194493 A1* 6/2019 Yokoi .................... B24B 37/00

FOREIGN PATENT DOCUMENTS

| | | | |
|---|---|---|---|
| JP | 2008-285508 A | | 11/2008 |
| JP | 2012-38816 A | | 2/2012 |
| JP | 2016-119359 A | | 6/2016 |
| KR | 100906043 | * | 7/2009 |

* cited by examiner

| Processing liquid temperature | Selectivity |
|---|---|
| 120°C | 5.3 |
| 150°C | 9.7 |

# SUBSTRATE TREATMENT METHOD AND SUBSTRATE TREATMENT DEVICE

This is a National Phase Application filed under 35 U.S.C. 371 as a national stage of PCT/JP2019/022225, filed Jun. 4, 2019, an application claiming the benefit of Japanese Application No. 2018-112512, filed Jun. 13, 2018, the content of each of which is hereby incorporated by reference in its entirety.

TECHNICAL FIELD

The present disclosure relates to a substrate treatment method and a substrate treatment device.

BACKGROUND

In the related art, in a case in which two kinds of materials (for example, a wiring material and a diffusion prevention film) are contained in a film formed on a substrate such as a semiconductor wafer (hereinafter, also referred to as a "wafer") or the like, a technique of selectively etching one of the materials is known (see Patent Document 1).

PRIOR ART DOCUMENTS

Patent Documents

Patent Document 1: Japanese laid-open publication No. 2008-285508

SUMMARY

The present disclosure provides some embodiments of a technique capable of etching one of two kinds of materials contained in a film formed on a substrate with high selectivity.

According to one embodiment of the present disclosure, there is provided a substrate treatment method according to an embodiment of the present disclosure that includes a temperature raising step of raising a temperature of a concentrated sulfuric acid, and a liquid supply step of supplying the concentrated sulfuric acid having the raised temperature to a substrate placed on a substrate processing part.

According to the present disclosure, it is possible to etch one of two kinds of materials contained in a film formed on a substrate with high selectivity.

DETAILED DESCRIPTION

An embodiment of a substrate treatment method and a substrate treatment device disclosed in the present disclosure will now be described in detail with reference to the accompanying drawings. Further, the present disclosure is not limited to embodiments described below. In addition, it should be noted that the drawings are schematic, and the relationships between dimensions of respective elements, the ratios of the respective elements, and the like may differ from reality. Also, there may be a case where the relationship of dimensions and the ratios differ from each other between the drawings.

In the related art, in a case in which two kinds of materials (for example, a wiring material and a diffusion prevention film) are contained in a film formed on a substrate such as a semiconductor wafer (hereinafter, also referred to as a wafer) or the like, a technique of selectively etching one of the materials is known. However, it was often difficult to obtain desired selectivity according to a combination of the two kinds of materials.

Therefore, it is expected that one of the two kinds of materials contained in the film formed on the substrate is etched with high selectivity.

<Outline of the Substrate Processing System>

Figure 1:
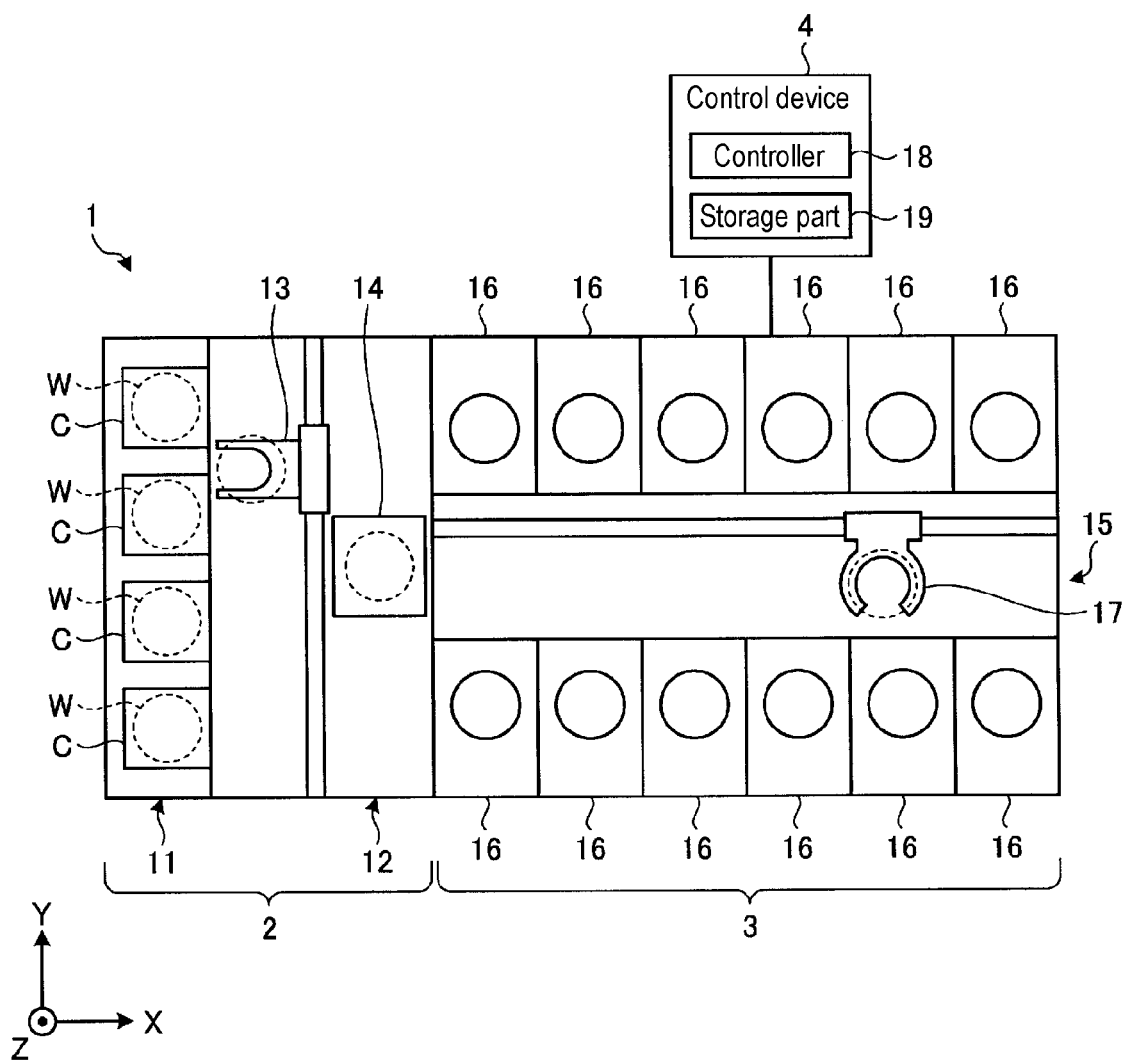
FIG. 1 is a schematic diagram illustrating a schematic configuration of a substrate processing system according to an embodiment of the present disclosure.

First, a schematic configuration of a substrate processing system 1 according to an embodiment of the present disclosure will be described with reference to FIG. 1. FIG. 1 is a diagram illustrating the schematic configuration of the substrate processing system 1 according to an embodiment of the present disclosure. The substrate processing system 1 is an example of a substrate treatment device. In the following description, in order to clarify the positional relationship, an X-axis, a Y-axis, and a Z-axis orthogonal to each another are defined, and the positive direction of the Z-axis is defined as a vertical upward direction.

As illustrated in FIG. 1, the substrate processing system 1 includes a loading/unloading station 2 and a processing station 3. The loading/unloading station 2 and the processing station 3 are provided adjacent to each other.

The loading/unloading station 2 includes a carrier placement part 11 and a transfer part 12. A plurality of carriers C for accommodating a plurality of substrates (in the present embodiment, semiconductor wafers W (hereinafter, referred to as wafers W)) in a horizontal posture are placed on the carrier placement part 11.

The transfer part 12 is provided adjacent to the carrier placement part 11, and includes a substrate transfer device 13 and a delivery part 14 provided therein. The substrate transfer device 13 includes a wafer holding mechanism for holding the wafer W. Furthermore, the substrate transfer device 13 can horizontally and vertically move and rotate around a vertical axis thereof, and transfers the wafer W between the carriers C and the delivery part 14 using the wafer holding mechanism.

The processing station 3 is provided adjacent to the transfer part 12. The processing station 3 includes a transfer part 15 and a plurality of processing units 16. The plurality of processing units 16 are provided to be arranged on both sides of the transfer part 15.

The transfer part 15 includes a substrate transfer device 17 provided therein. The substrate transfer device 17 includes a wafer holding mechanism for holding the wafer W. Also, the substrate transfer device 17 can horizontally and vertically move and rotate around a vertical axis thereof, and transfers the wafer W between the delivery part 14 and the processing units 16 using the wafer holding mechanism.

Each of the processing units 16 performs a predetermined substrate processing on the wafer W transferred by the substrate transfer device 17.

In addition, the substrate processing system 1 includes a control device 4. The control device 4 is, for example, a computer, and includes a controller 18 and a storage part 19. A program for controlling various processes performed by the substrate processing system 1 is stored in the storage part 19. The controller 18 controls the operation of the substrate processing system 1 by reading the program stored in the storage part 19 and executing the same.

The program has been stored in a computer-readable storage medium, and may be installed on the storage part 19 of the control device 4 from the storage medium. The computer-readable storage medium includes, for example, a hard disk (HD), a flexible disk (FD), a compact disc (CD), a magneto-optical disc (MO), and a memory card, and the like.

In the substrate processing system 1 configured as described above, first, the substrate transfer device 13 of the loading/unloading station 2 picks up the wafer W from any of the carriers C placed on the carrier placement part 11, and places the same on the delivery part 14. The wafer W placed on the delivery part 14 is picked up from the delivery part 14 by the substrate transfer device 17 of the processing station 3 and loaded into any of the processing units 16.

The wafer W loaded into the processing unit 16 is processed by the processing unit 16, and then unloaded from the processing unit 16 by the substrate transfer device 17 and placed on the delivery part 14. Then, the processed wafer W placed on the delivery part 14 is returned to the carrier C of the carrier placement part 11 by the substrate transfer device 13.

<Configuration of the Processing Unit>

Figure 2:
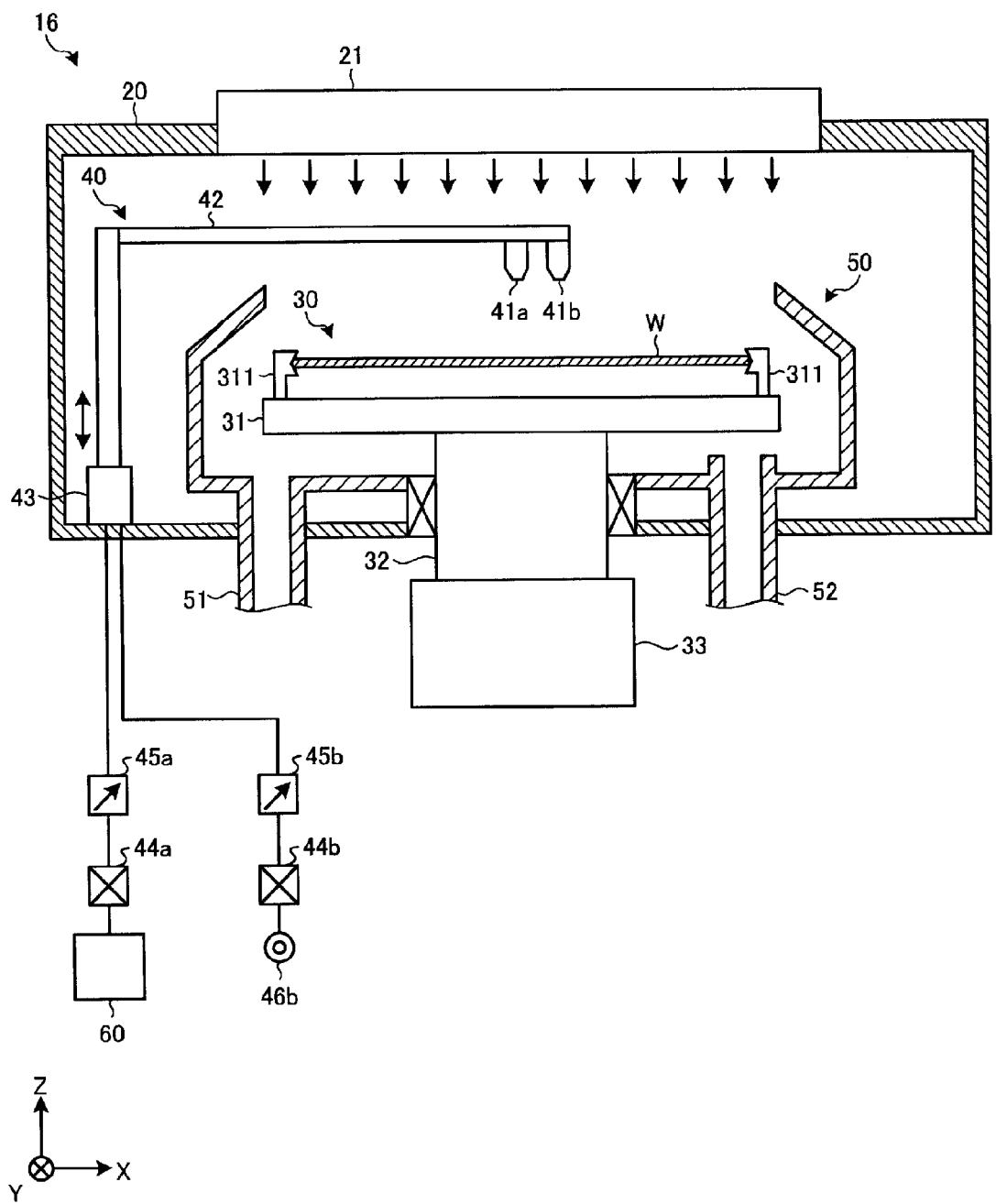
FIG. 2 is a schematic diagram illustrating a specific configuration example of a processing unit.

Next, a configuration of the processing unit 16 will be described with reference to FIG. 2. FIG. 2 is a schematic view illustrating a specific configuration example of the processing unit 16. As illustrated in FIG. 2, the processing unit 16 includes a chamber 20, a substrate processing part 30, a liquid supply part 40, and a recovery cup 50.

The chamber 20 accommodates the substrate processing part 30, the liquid supply part 40, and the recovery cup 50. A fan filter unit (FFU) 21 is provided on a ceiling of the chamber 20. The FFU 21 forms a down-flow inside the chamber 20.

The substrate processing part 30 includes a holder 31, a pillar 32 and a driver 33, and performs liquid processing on the placed wafer W. The holder 31 horizontally holds the wafer W. The pillar 32 is a member extending in the vertical direction, and includes a base end portion rotatably supported by the driver 33 and a leading end portion that horizontally supports the holder 31. The driver 33 rotates the pillar 32 around the vertical axis.

The substrate processing part 30 rotates the holder 31 supported by the pillar 32 by rotating the pillar 32 using the driver 33, so as to rotate the wafer W held by the holder 31.

A holding member 311 for holding the wafer W from the side surface of the wafer W is provided on an upper surface of the holder 31 included in the substrate processing part 30. The wafer W is horizontally held by the holding member 311 in a state slightly separated from the upper surface of the holder 31. Furthermore, the wafer W is held by the holder 31, in a state in which a surface of the wafer W on which the substrate processing is performed is oriented upward.

The liquid supply part 40 supplies a processing fluid to the wafer W. The liquid supply part 40 includes a plurality of (two in this case) nozzles 41a and 41b, an arm 42 for horizontally supporting the nozzles 41a and 41b, and a rotating/elevating mechanism 43 for rotating and elevating the arm 42.

The nozzle 41a is connected to a processing liquid supply part 60 via a valve 44a and a flow rate regulator 45a. Details of the processing liquid supply part 60 will be described later.

The nozzle 41b is connected to a DIW source 46b via a valve 44b and a flow rate regulator 45b. The DIW (deionized water) is used for, for example, a rinsing process. A processing liquid used for the rinsing process is not limited to the DIW.

A processing liquid L (see FIGS. 3A and 3B) supplied from the processing liquid supply part 60 is discharged from the nozzle 41a. Details of the processing liquid L will be described later. The DIW supplied from the DIW source 46b is discharged from the nozzle 41b.

The recovery cup 50 is arranged so as to surround the holder 31, and collects the processing liquid scattered from the wafer W with the rotation of the holder 31. A drainage port 51 is formed at the bottom of the recovery cup 50 so that the processing liquid collected by the recovery cup 50 is discharged from the drainage port 51 to the outside of the processing unit 16. In addition, an exhaust port 52 for discharging a gas supplied from the FFU 21 to the outside of the processing unit 16 is formed at the bottom of the recovery cup 50.

Furthermore, although there is illustrated an example in which two nozzles are provided in the processing unit 16 of the present embodiment, the number of nozzles provided in the processing unit 16 is not limited to two. For example, an IPA source for supplying isopropyl alcohol (IPA) and a third nozzle connected to the IPA source may be provided so that the IPA is discharged from the third nozzle.

<Details of the Cleaning Process>

Figure 3A:
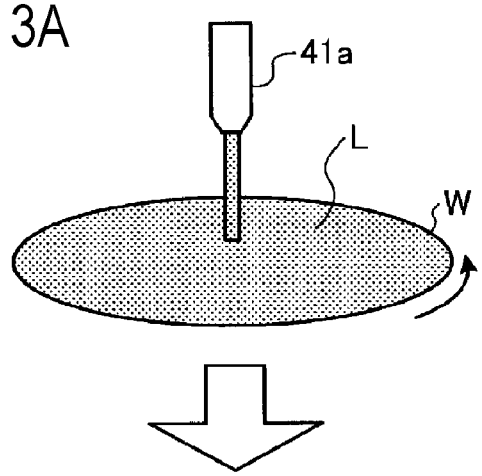
FIGS. 3A and 3B are diagrams illustrating an outline of an etching process according to an embodiment of the present disclosure.
Figure 3B:
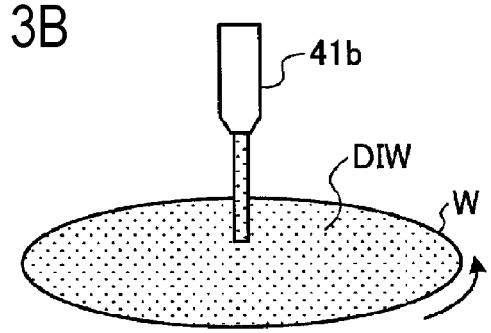

Next, details of an etching process of the wafer W in the processing unit 16 will be described with reference to FIGS. 3A and 3B. FIGS. 3A and 3B are diagrams illustrating an outline of the etching process in the present embodiment. Further, it is assumed that tungsten (W) and titanium nitride (TiN) of different materials are contained in a film formed on the surface of the wafer W on which the etching process is to be performed.

First, the wafer W is loaded into the chamber 20 of the processing unit 16 by the substrate transfer device 17. Then, the wafer W is held by the holding member 311 of the substrate processing part 30 with the surface subjected to the substrate processing oriented upward. Thereafter, the holding member 311 rotates with the wafer W at a predetermined rotational speed by the driver 33.

Next, as illustrated in FIG. 3A, the etching process by the processing liquid L is performed in the processing unit 16. In this etching process, the nozzle 41a of the liquid supply part 40 moves to above the center of the wafer W.

Thereafter, the valve 44a is opened for a predetermined period of time to supply the processing liquid L consisting of concentrated sulfuric acid onto the surface of the wafer W.

In the present embodiment, the processing liquid L raised to a predetermined temperature or higher is supplied to the wafer W. Thus, reactions of the following formulas (1) and (2) occur inside the processing liquid L.

$$2H_2SO_4 \rightarrow H_3SO_4^+ + HSO_4^- \qquad (1)$$

$$H_3SO_4^+ \rightarrow H^+ H_2SO_4 \qquad (2)$$

Then, $H^+$ generated by the reaction selectively reacts with the titanium nitride out of the tungsten and the titanium nitride contained in the film formed on the surface of the wafer W, as indicated in the following formula (3).

$$TiN + 4H^+ \rightarrow Ti_3^+ + NH_4^+ \qquad (3)$$

Since $Ti^{+3}$ generated by the reaction of the formula (3) is dissolved in the processing liquid L, the processing liquid L can selectively etch the titanium nitride based on the reactions of the formulas (1) to (3). Thus, according to the present embodiment, it is possible to etch the titanium nitride out of the tungsten and the titanium nitride contained in the film formed on the surface of the wafer W with high selectivity.

Furthermore, in the present embodiment, pure water may be added to the processing liquid L consisting of concentrated sulfuric acid. Thus, in addition to the formulas (1) and (2), reactions of the following formulas (4) and (5) occur in the processing liquid L.

$$H_2O + H_2SO_4 \rightarrow H_3O^+ + HSO_4^- \qquad (4)$$

$$H_3O^+ \rightarrow H^+ + H_2O \qquad (5)$$

By the reactions of the formulas (4) and (5), a relatively large amount of $H^+$ is supplied into the processing liquid L. Therefore, in the present embodiment, since the reaction of the formula (3) is promoted, the processing liquid L can further selectively etch the titanium nitride.

The following is a detailed description of FIGS. 3A and 3B. Next, in the processing unit 16, as illustrated in FIG. 3B, the rinsing process with DIW is performed. In such a rinsing process, the nozzle 41b of the liquid supply part 40 moves to above the center of the wafer W, and the valve 44b is opened for a predetermined period of time to supply DIW at room temperature, which is a rinsing liquid, onto the surface of the wafer W. By the rinsing process, it is possible to remove residues such as the processing liquid L, the etched titanium nitride or the like remaining on the wafer W. The temperature of DIW in the rinsing process may be room temperature or a temperature higher than room temperature.

Subsequently, in the processing unit 16, a drying process of drying the wafer W is performed. In such a drying process, for example, the DIW on the wafer W held by the holding member 311 is dropped by rotating the holding member 311 at high speed by the driver 33. Instead of dropping the DIW, the DIW may be substituted by IPA and then the IPA may be dropped to dry the wafer W.

Thereafter, an unloading process is performed in the processing unit 16. In the unloading process, after the rotation of the wafer W is stopped, the wafer W is unloaded from the processing unit 16 by the substrate transfer device 17. As the unloading process ends, a series of etching processes for one wafer W is completed.

<Configuration of the Processing Liquid Supply Part>

Figure 4:
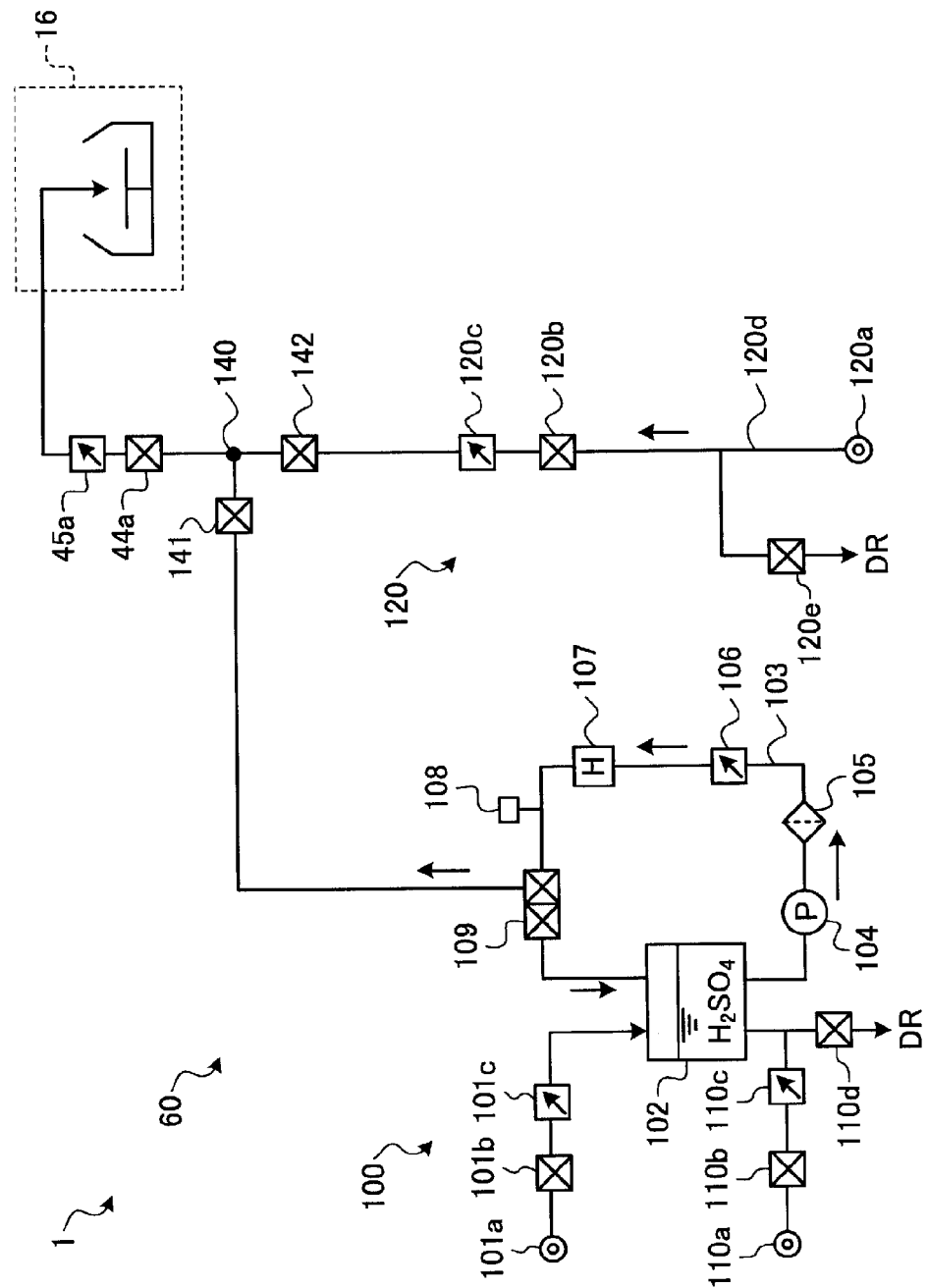
FIG. 4 is a diagram illustrating a configuration of a processing liquid supply part according to an embodiment of the present disclosure.

Next, a configuration of the processing liquid supply part 60 included in the substrate processing system 1 will be described with reference to FIG. 4. FIG. 4 is a diagram illustrating the configuration of the processing liquid supply part 60 according to an embodiment of the present disclosure. Respective parts of the processing liquid supply part 60 illustrated below may be controlled by the controller 18.

As illustrated in FIG. 4, the processing liquid supply part 60 according to the present embodiment includes a concentrated sulfuric acid supply part 100, a pure water supply part 120, and an addition part 140.

The concentrated sulfuric acid supply part 100 supplies concentrated sulfuric acid. The concentrated sulfuric acid supply part 100 includes a concentrated sulfuric acid source 101a, a valve 101b, a flow rate regulator 101c, a tank 102, and a circulation line 103.

The concentrated sulfuric acid source 101a is connected to the tank 102 via the valve 101b and the flow rate regulator 101c. Thus, the concentrated sulfuric acid supply part 100 can supply the concentrated sulfuric acid from the concentrated sulfuric acid source 101a to the tank 102 and store the concentrated sulfuric acid in the tank 102.

Furthermore, the circulation line 103 is a circulation line that starts from the tank 102 and returns to the tank 102. A pump 104, a filter 105, a flow rate regulator 106, a heater 107, a thermocouple 108, and a switching part 109 are provided in the circulation line 103 sequentially from the upstream side with the tank 102 as a reference.

The pump 104 forms a circulation flow of the concentrated sulfuric acid, which starts from the tank 102, passes through the circulation line 103, and returns to the tank 102. The filter 105 removes contaminants such as particles or the like contained in the concentrated sulfuric acid circulating in the circulation line 103. The flow rate regulator 106 adjusts a flow rate of the circulation flow of the concentrated sulfuric acid passing through the circulation line 103.

The heater 107 heats the concentrated sulfuric acid circulating in the circulation line 103. The thermocouple 108 measures a temperature of the concentrated sulfuric acid circulating in the circulation line 103. Therefore, the controller 18 can control the temperature of the concentrated sulfuric acid circulating in the circulation line 103 by using the heater 107 and the thermocouple 108.

The switching part 109 is connected to the addition part 140 of the processing liquid supply part 60, and can switch the orientation of the concentrated sulfuric acid circulating in the circulation line 103 to the tank 102 or the addition part 140.

In addition, a pure water source 110a, a valve 110b, a flow rate regulator 110c, and a valve 110d are provided in the tank 102. The tank 102 is connected to a drain part via the valve 110d, and the pure water source 110a is connected between the tank 102 and the valve 110d via the valve 110b and the flow rate regulator 110c.

Thus, the controller 18 can control the valve 110b, the flow rate regulator 110c and the valve 110d to dilute the concentrated sulfuric acid in the tank 102 in a predetermined concentration and then discharge the same to the drain part, when exchanging the concentrated sulfuric acid in the tank 102.

The pure water supply part 120 supplies pure water. Such pure water is, for example, DIW. The pure water supply part 120 has a pure water source 120a, a valve 120b, a flow rate regulator 120c, a pipe 120d, and a valve 120e.

Furthermore, the pipe 120d connects between the pure water source 120a and the addition part 140 via the valve 120b and the flow rate regulator 120c. Thus, the pure water supply part 120 can supply the pure water at a desired flow rate to the addition part 140.

In addition, the pure water source 120a is connected to the drain part via the valve 120e. Thus, the controller 18 can control the valve 120e to discharge the pure water in the pure water source 120a to the drain part, when exchanging the pure water in the pure water source 120a.

The addition part 140 adds the pure water supplied from the pure water supply part 120 to the concentrated sulfuric acid supplied from the concentrated sulfuric acid supply part 100. In the present embodiment, the addition part 140 is a portion in which a pipe extending from the switching part 109 of the concentrated sulfuric acid supply part 100 and the pipe 120d extending from the pure water source 120a are joined.

In addition, a first valve 141 is provided between the concentrated sulfuric acid supply part 100 and the addition part 140, and a second valve 142 is provided between the pure water supply part 120 and the addition part 140.

Furthermore, the addition part 140 is connected to the processing unit 16 via the valve 44a and the flow rate regulator 45a described above. Thus, the processing liquid supply part 60 can supply the processing liquid L in which the concentrated sulfuric acid and the pure water are mixed at a predetermined ratio to the processing unit 16.

Furthermore, as described above, the heater 107 is provided in the concentrated sulfuric acid supply part 100. The temperature of the processing liquid L rises by the reaction of the concentrated sulfuric acid with the pure water in the addition part 140. Thus, the processing liquid supply part 60 of the present embodiment can raise the temperature of the processing liquid L to a desired temperature and supply the same to the processing unit 16.

For example, the processing liquid supply part 60 can raise the temperature of the concentrated sulfuric acid to about 120 degrees C. using the heater 107 of the concentrated sulfuric acid supply part 100, so as to raise the processing liquid L to about 150 degrees C. in the addition part 140.

That is, in the processing liquid supply part 60 of the present embodiment, the heater 107 and the addition part 140 function as a temperature rising mechanism for raising the temperature of the processing liquid L. The temperature raising mechanism of the present embodiment is not limited to the heater 107 and the addition part 140. A heater or the like separately added near the nozzle 41a may be used as the temperature raising mechanism.

Although not shown in FIG. 4, a valve or the like may be separately provided in the circulation line 103 or the like.

Experimental Results

Figures 5, 6:
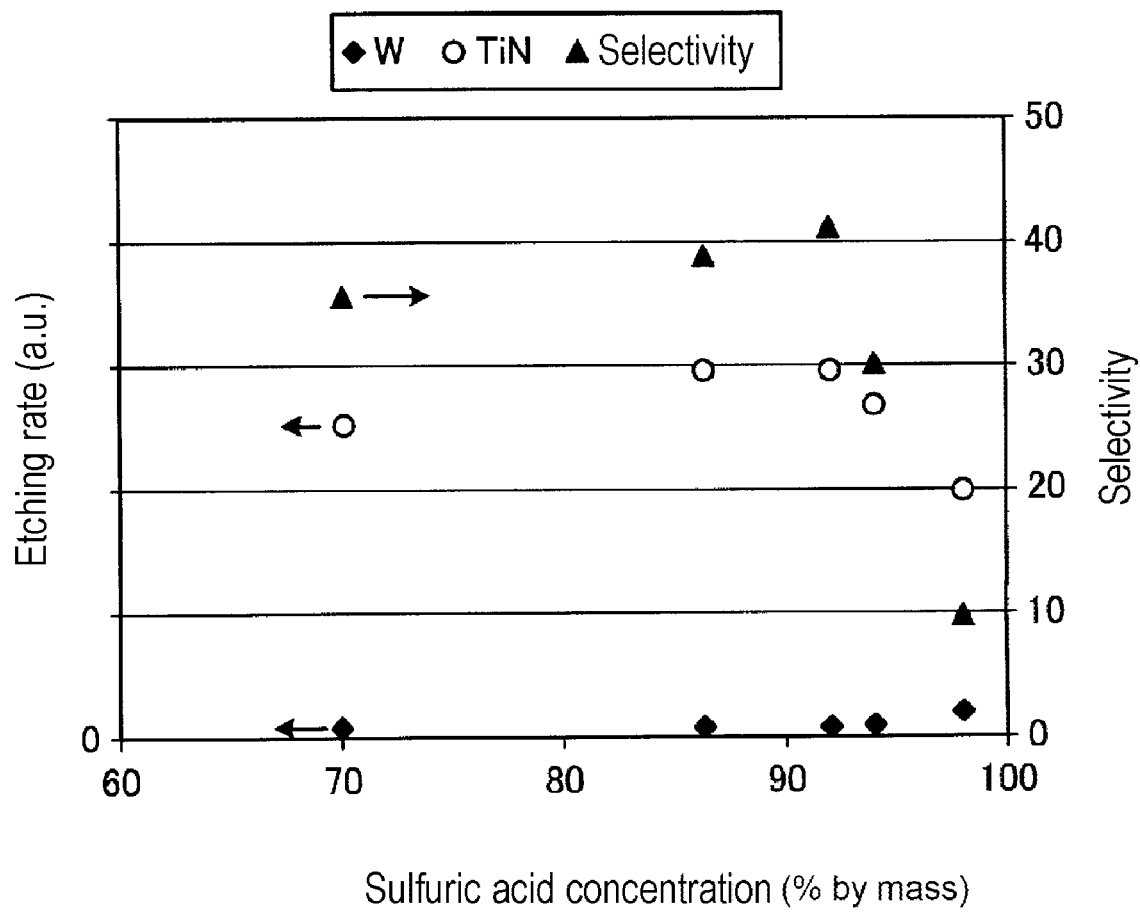
FIG. 5 is a diagram illustrating a relationship between a temperature of a processing liquid and etching selectivity according to an embodiment of the present disclosure.
FIG. 6 is a diagram illustrating a relationship between an etching rate of tungsten, an etching rate of titanium nitride and etching selectivity, and a sulfuric acid concentration according to an embodiment of the present disclosure.

Next, in the substrate processing system 1 of the present embodiment, experimental results for determining how a ratio of the etching rate of the titanium nitride to the etching rate of the tungsten (i.e., the etching selectivity) change under various conditions will be described. FIG. 5 is a diagram illustrating a relationship between the temperature of the processing liquid L and the etching selectivity according to the present embodiment.

Experimental results shown in FIG. 5 are measured values when the temperature of the processing liquid L consisting of the concentrated sulfuric acid (i.e., the concentration of the sulfuric acid of 98 (% by mass)) is set to 120 degrees C. and 150 degrees C. Furthermore, the etching of tungsten and titanium nitride was performed with individual materials and the etching time was 60 seconds.

As shown in FIG. 5, it can be seen that the etching selectivity is improved as the temperature of the processing liquid L consisting of the concentrated sulfuric acid rises. The reason for this experimental results is that the reactions of the formulas (1) to (3) are promoted as the temperature of the processing liquid L rises.

As described above, it is possible to obtain the desired selectivity by raising the temperature of the processing liquid L to 130 degrees C. or higher (for example, 150 degrees C.). The upper limit of the temperature of the processing liquid L is not particularly limited but may be a boiling point (for example, 290 degrees C. in the case of the concentrated sulfuric acid) or lower of the processing liquid L.

Next, experimental results for determining a relationship between the etching selectivity and the concentration of the sulfuric acid in the processing liquid L will be described with reference to FIG. 6. FIG. 6 is a diagram illustrating a relationship between the etching rate of the tungsten, the etching rate and the etching selectivity of titanium nitride, and the sulfuric acid concentration in the present embodiment.

The experimental results shown in FIG. 6 are measured values when the temperature of the processing liquid L is 150 degrees C. Furthermore, the etching of tungsten and titanium nitride was performed with individual materials and the etching time was 60 seconds.

As shown in FIG. 6, the etching rate of the titanium nitride is increased by reducing the concentration of the sulfuric acid in the processing liquid L, compared with a condition in which the concentration of the sulfuric acid in the processing liquid L is 98 (% by mass) (i.e., the concentrated sulfuric acid).

This is because the reactions of the formulas (4) and (5) occur, in addition to the reactions of the formulas (1) to (3), by reducing the concentration of the sulfuric acid in the processing liquid L, i.e., by adding pure water to the concentrated sulfuric acid.

Furthermore, in the present embodiment, the etching rate of the tungsten is reduced by reducing the concentration of the sulfuric acid in the processing liquid L, compared with a condition in which the concentration of the sulfuric acid in the processing liquid L is 98 (% by mass).

In the present disclosure, since the tungsten is etched regardless of acid or alkali if it is a solution containing an oxidizing agent (oxidization action), the tungsten is etched by the concentrated sulfuric acid functioning as the oxidizing agent. Then, in the present embodiment, since the function of the processing liquid L as the oxidizing agent is reduced by reducing the concentration of the sulfuric acid in the processing liquid L, the etching rate of the tungsten is reduced.

As described thus far, in the present embodiment, the etching rate of the titanium nitride is increased and the etching rate of the tungsten is reduced by reducing the concentration of the sulfuric acid in the processing liquid L. Thus, as indicated in FIG. 6, it is possible to significantly improve the etching selectivity by reducing the concentration of the sulfuric acid in the processing liquid L.

Therefore, according to the present embodiment, it is possible to etch the titanium nitride out of the tungsten and the titanium nitride contained in the film formed on the surface of the wafer W with high selectivity.

In the present embodiment, the concentration of the sulfuric acid in the processing liquid L may be set to 70 to 97% by mass. By setting the concentration of the sulfuric acid to such a range, the reactions of the formulas (1) to (5) can occur in a balanced manner in the processing liquid L. Therefore, according to the present embodiment, it is possible to significantly improve the etching rate of the titanium nitride.

Furthermore, when the concentration of the sulfuric acid in the processing liquid L is set lower than 70%, since the number of sulfuric acid atoms contributed to the reactions of the formulas (1) to (3) is reduced in the processing liquid L, the etching rate of the titanium nitride may be lowered.

Furthermore, in the present embodiment, the processing liquid L is not limited to the case where the pure water is added to the concentrated sulfuric acid but may include the concentrated sulfuric acid alone. Also, in the present embodiment, the combination of two kinds of materials contained in the film formed on the surface of the wafer W is not limited to the combination of the tungsten and the titanium nitride, but may be a combination of aluminum oxide and titanium nitride. Even in this case, it is possible to etch the titanium nitride with high selectivity.

<Details of the Processing Liquid Supply Process>

Figure 7A:
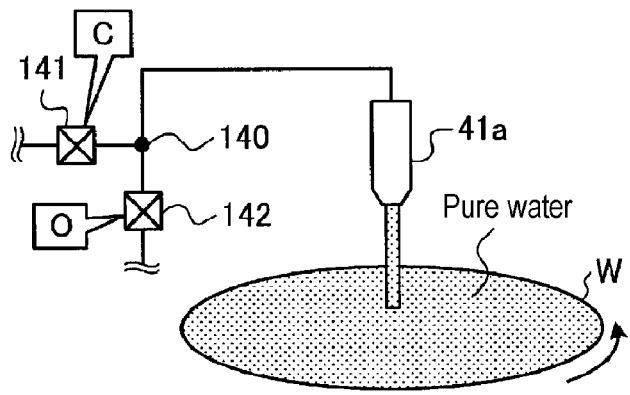
FIGS. 7A to 7C are diagrams illustrating details of a processing liquid supply process according to an embodiment of the present disclosure.
Figure 7B:
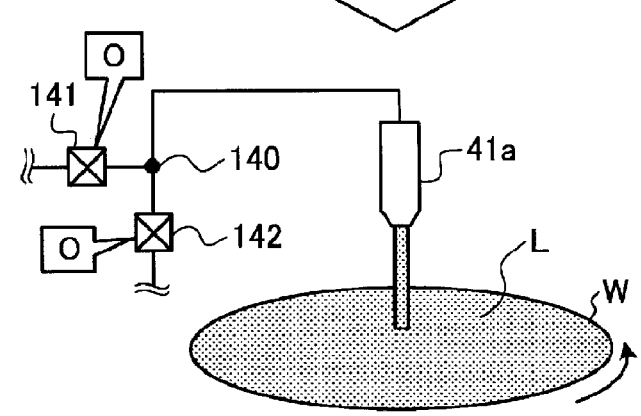
Figure 7C:
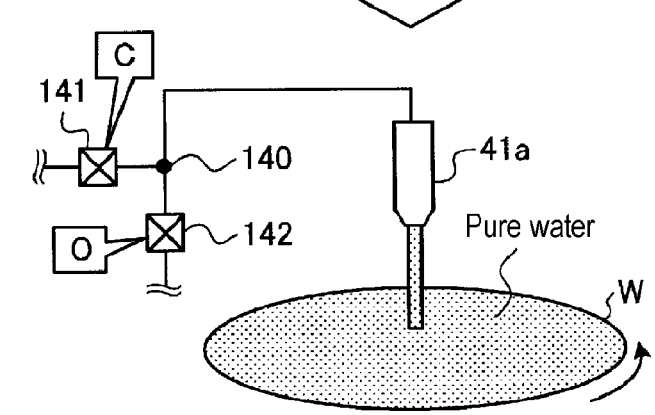

Next, details of the process of supplying the processing liquid L to the wafer W in the present embodiment will be described with reference to FIGS. 7A to 7C. FIGS. 7A to 7C are diagrams illustrating details of the processing liquid supply process according to the present embodiment.

As described above, the etching of the titanium nitride greatly varies depending on the concentration of the sulfuric acid in the processing liquid L. Therefore, when the concentration of the sulfuric acid in the processing liquid L generated by the addition part 140 is changed from a desired concentration, the etching of the titanium nitride may be varied.

Therefore, in the present embodiment, the following process was performed to suppress the variation in the etching of the titanium nitride. First, the controller 18 closes the first valve 141 and opens the second valve 142 to supply the pure water from the nozzle 41*a* to the wafer W, as illustrated in FIG. 7A, before supplying the processing liquid L in which the pure water is added to the concentrated sulfuric acid at a predetermined ratio to the wafer W.

Furthermore, in FIGS. 7A to 7C, the closed state of the first valve 141 or the second valve 142 is indicated by "C", and the opened state of the first valve 141 or the second valve 142 is indicated by "O".

In the present disclosure, since the pure water does not contribute to the etching of the titanium nitride, it is possible to suppress the supply of the processing liquid L with varying sulfuric acid concentration to the wafer W before etching is performed with the processing liquid L having a predetermined sulfuric acid concentration.

Therefore, according to the present embodiment, it is possible to suppress the variation in the etching of the titanium nitride before etching is performed with the processing liquid L with a predetermined sulfuric acid concentration.

Subsequently, as illustrated in FIG. 7B, the controller 18 opens the first valve 141 and the second valve 142 to supply the processing liquid L generated by the addition part 140 to the wafer W, so as to perform the etching process on the wafer W.

Then, when the etching of the wafer W with the processing liquid L is completed, the controller 18 closes the first valve 141 and opens the second valve 142 to supply the pure water from the nozzle 41*a* to the wafer W, as illustrated in FIG. 7C. Thus, it is possible to suppress the supply of the processing liquid L with varying sulfuric acid concentration to the wafer W after etching is performed with the processing liquid L having a predetermined sulfuric acid concentration.

Therefore, according to the present embodiment, it is possible to suppress the variation in the etching of the titanium nitride after etching is performed with the processing liquid L having a predetermined sulfuric acid concentration.

As described thus far, in the present embodiment, it is possible to suppress the variation in the etching of the titanium nitride by controlling the first valve 141 and the second valve 142 when supplying the processing liquid L.

<Modifications>

Figure 8:
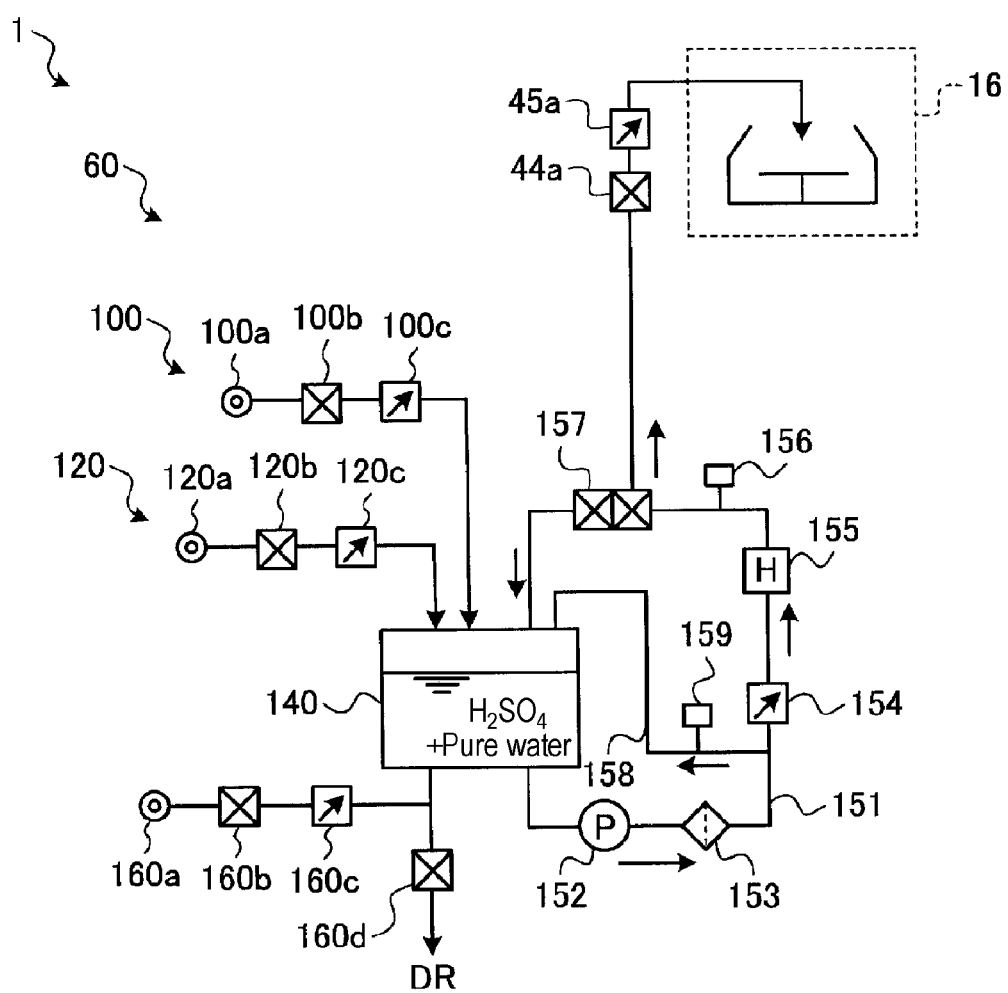
FIG. 8 is a diagram illustrating a configuration of a processing liquid supply part according to a first modification of an embodiment of the present disclosure.

Next, configurations of processing liquid supply parts 60 according to various modifications of the present embodiment will be described with reference to FIGS. 8 and 9. FIG. 8 is a diagram illustrating a configuration of a processing liquid supply part 60 according to a first modification of the present embodiment.

As illustrated in FIG. 8, in the processing liquid supply part 60 of the first modification, an addition part 140 is not configured to be provided in a place where the pipes are joined, but is configured by a tank.

A concentrated sulfuric acid supply part 100 has a concentrated sulfuric acid source 100*a*, a valve 100*b*, and a flow rate regulator 100*c*. The concentrated sulfuric acid source 100*a* is connected to the addition part 140 via the valve 100*b* and the flow rate regulator 100*c*. Thus, the concentrated sulfuric acid supply part 100 can supply the concentrated sulfuric acid to the addition part 140.

A pure water supply part 120 has a pure water source 120*a*, a valve 120*b*, and a flow rate regulator 120*c*. The pure water source 120*a* is connected to the addition part 140 via the valve 120*b* and the flow rate regulator 120*c*. Thus, the pure water supply part 120 can supply pure water to the addition part 140.

The addition part 140 adds the pure water supplied from the pure water supply part 120 to the concentrated sulfuric acid supplied from the concentrated sulfuric acid supply part 100 to generate the processing liquid L. In the first modification, the addition part 140 is a tank and stores the processing liquid L.

In addition, a circulation line 151, which starts from the addition part 140 and returns to the addition part 140, is provided in the addition part 140 which is a tank. Furthermore, a pump 152, a filter 153, a flow rate regulator 154, a heater 155, a thermocouple 156, and a switching part 157 are provided in the circulation line 151 sequentially from the upstream side with the addition part 140 as a reference.

The pump 152 forms a circulation flow of a mixed liquid, which starts from the addition part 140, passes through the circulation line 151 and returns to the addition part 140. The filter 153 removes contaminants such as particles contained in the processing liquid L circulating through the circulation line 151. The flow rate regulator 154 adjusts a flow rate of the circulation flow of the mixed liquid passing through the circulation line 151.

The heater 155 heats the mixed liquid circulating in the circulation line 151. The thermocouple 156 measures a temperature of the mixed liquid circulating in the circulation line 151. Then, the controller 18 can control the temperature of the processing liquid L circulating in the circulation line 151 by using the heater 155 and the thermocouple 156.

Therefore, the processing liquid supply part 60 of the first modification can raise the processing liquid L to a desired temperature and supply the same to the processing unit 16. That is, in the first modification, the heater 155 functions as a temperature raising mechanism for the processing liquid L.

The switching part 157 is connected to the processing unit 16 via the valve 44*a* and the flow rate regulator 45*a*, and can switch the orientation of the processing liquid L circulating in the circulation line 151 to the processing unit 16 or the addition part 140.

Furthermore, a branch line 158, which is branched from between the filter 153 and the flow rate regulator 154 and is connected to the addition part 140, is provided in the circulation line 151. Since a densitometer 159 is provided in the branch line 158, the controller 18 can measure a concentration of the sulfuric acid in the processing liquid L circulating in the circulation line 151 by using the densitometer 159.

In addition, the controller 18 can control the concentrated sulfuric acid supply part 100 and the pure water supply part 120 based on the measured sulfuric acid concentration in the processing liquid L to control the concentration of the sulfuric acid in the processing liquid L to a predetermined concentration.

Furthermore, a pure water source 160*a*, a valve 160*b*, a flow rate regulator 160*c*, and a valve 160*d* are provided in the addition part 140. The addition part 140 is connected to a drain part via the valve 160*d*, and the pure water source 160*a* is connected between the addition part 140 and the valve 160*d* via the valve 160*b* and the flow rate regulator 160*c*.

Thus, the controller 18 can control the valve 160*b*, the flow rate regulator 160*c*, and the valve 160*d* when exchanging the processing liquid L in the addition part 140 as a tank, to dilute the processing liquid L in the addition part 140 in a predetermined concentration and then discharge the same to the drain part.

As described thus far, in the processing liquid supply part 60 of the first modification, it is possible to stably generate the processing liquid L whose sulfuric acid concentration is controlled to a predetermined concentration by adding the pure water to the concentrated sulfuric acid in the addition part 140 as a tank.

Figure 9:
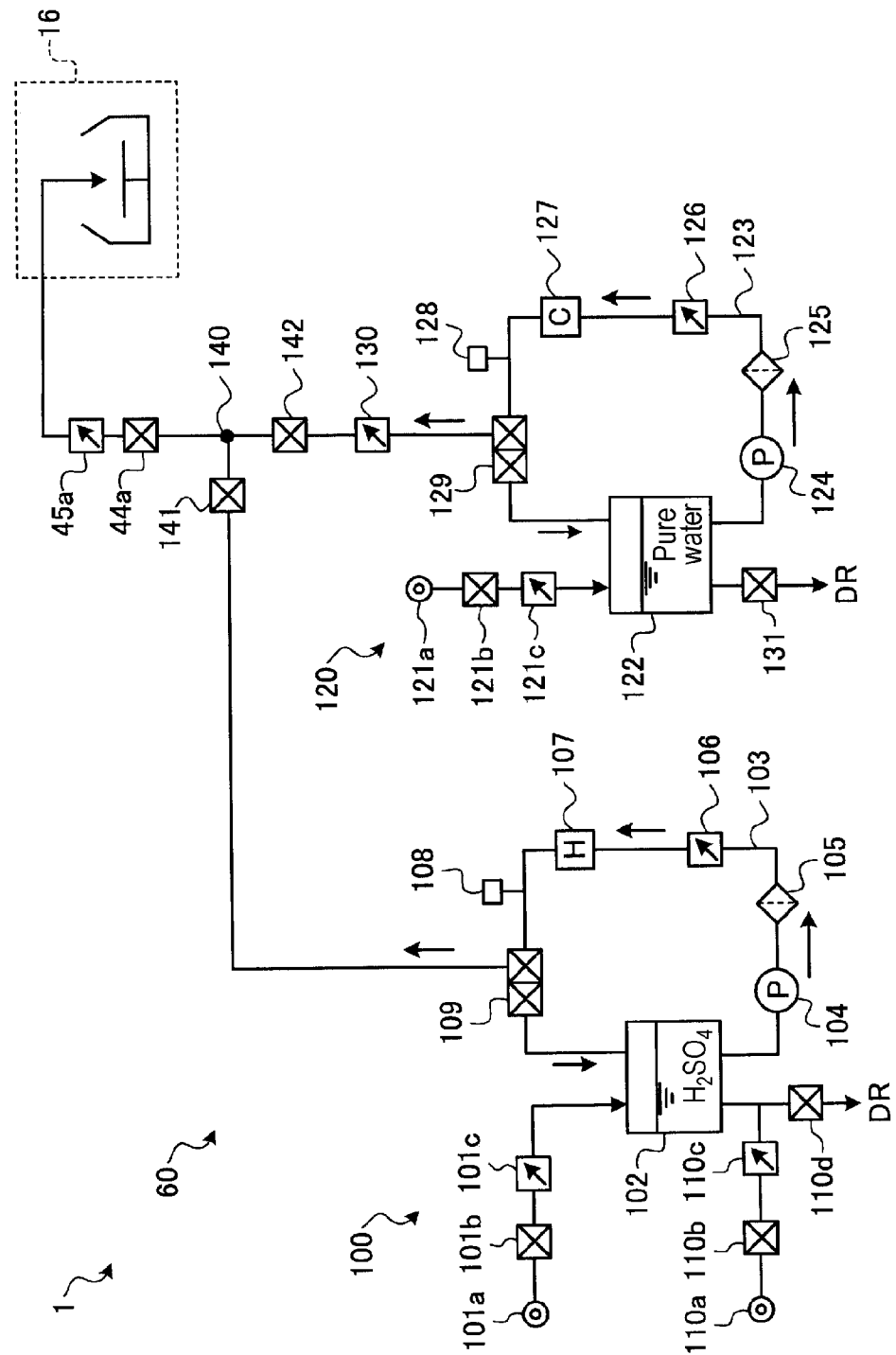
FIG. 9 is a diagram illustrating a configuration of a processing liquid supply part according to a second modification of an embodiment of the present disclosure.

FIG. 9 is a diagram illustrating a configuration of a processing liquid supply part 60 according to a second modification of the present embodiment. As illustrated in FIG. 9, in the processing liquid supply part 60 of the second modification, the configuration of the pure water supply part 120 is different from that of the present embodiment.

The pure water supply part 120 of the second modification has a pure water source 121*a*, a valve 121*b*, a flow rate regulator 121*c*, a tank 122, and a circulation line 123.

The pure water source 121*a* is connected to the tank 122 via the valve 121*b* and the flow rate regulator 121*c*. Thus, the pure water supply part 120 can supply the pure water from the pure water source 121*a* to the tank 122 and store the pure water in the tank 122.

Furthermore, the circulation line 123 is a circulation line which starts from the tank 122 and returns to the tank 122. A pump 124, a filter 125, a flow rate regulator 126, a cooler 127, a thermocouple 128, and a switching part 129 are provided in the circulation line 123 sequentially from the upstream side with the tank 122 as a reference.

The pump 124 forms a circulation flow of the pure water, which starts from the tank 122, passes through the circulation line 123 and returns to the tank 122. The filter 125 removes contaminants such as particles contained in the pure water circulating in the circulation line 123. The flow rate regulator 126 adjusts a flow rate of the circulation flow of the pure water passing through the circulation line 123.

The cooler 127 cools down the pure water circulating in the circulation line 123. The thermocouple 128 measures a temperature of the pure water circulating in the circulation line 123. Thus, the controller 18 can control the temperature of the pure water circulating in the circulation line 123 by using the cooler 127 and the thermocouple 128.

The switching part 129 is connected to the addition part 140 of the processing liquid supply part 60 via the flow rate regulator 130, and can switch the orientation of the pure water circulating in the circulation line 123 to the tank 122 or the addition part 140.

Furthermore, the tank 122 is connected to a drain part via the valve 131. Thus, the controller 18 can control the valve 131 to discharge the pure water in the tank 122 to the drain part when exchanging the pure water in the tank 122.

As described thus far, in the processing liquid supply part 60 of the second modification, it is possible to add the pure water having the controlled temperature to the processing liquid L by installing the cooler 127 in the pure water supply part 120. Thus, according to the second modification, it is possible to perform the processing with the pure water having the controlled temperature by more accurately raising the temperature of the processing liquid to a desired temperature and supplying the same to the processing unit 16.

The substrate treatment device (substrate processing system 1) according to the present embodiment includes the substrate processing part 30, the concentrated sulfuric acid supply part 100, the temperature raising mechanism, and the liquid supply part 40. The substrate processing part 30 performs liquid processing on the substrate (wafer W). The temperature raising mechanism raises the temperature of the processing liquid L consisting of the concentrated sulfuric acid supplied from the concentrated sulfuric acid supply part 100. The liquid supply part 40 supplies the temperature-raised processing liquid L to the substrate (wafer W) placed on the substrate processing part 30. Thus, it is possible to etch one of two kinds of materials contained in a film formed on the surface of the wafer W with high selectivity.

Furthermore, the substrate treatment device (substrate processing system 1) according to the present embodiment further includes the pure water supply part 120 and the addition part 140. The addition part 140 adds the pure water supplied from the pure water supply part 120 to the processing liquid L. Thus, it is possible to significantly improve the etching selectivity.

Moreover, in the substrate treatment device (substrate processing system 1) according to the present embodiment, the processing liquid L does not contain hydrogen peroxide.

<Processing Procedures>

Figure 10:
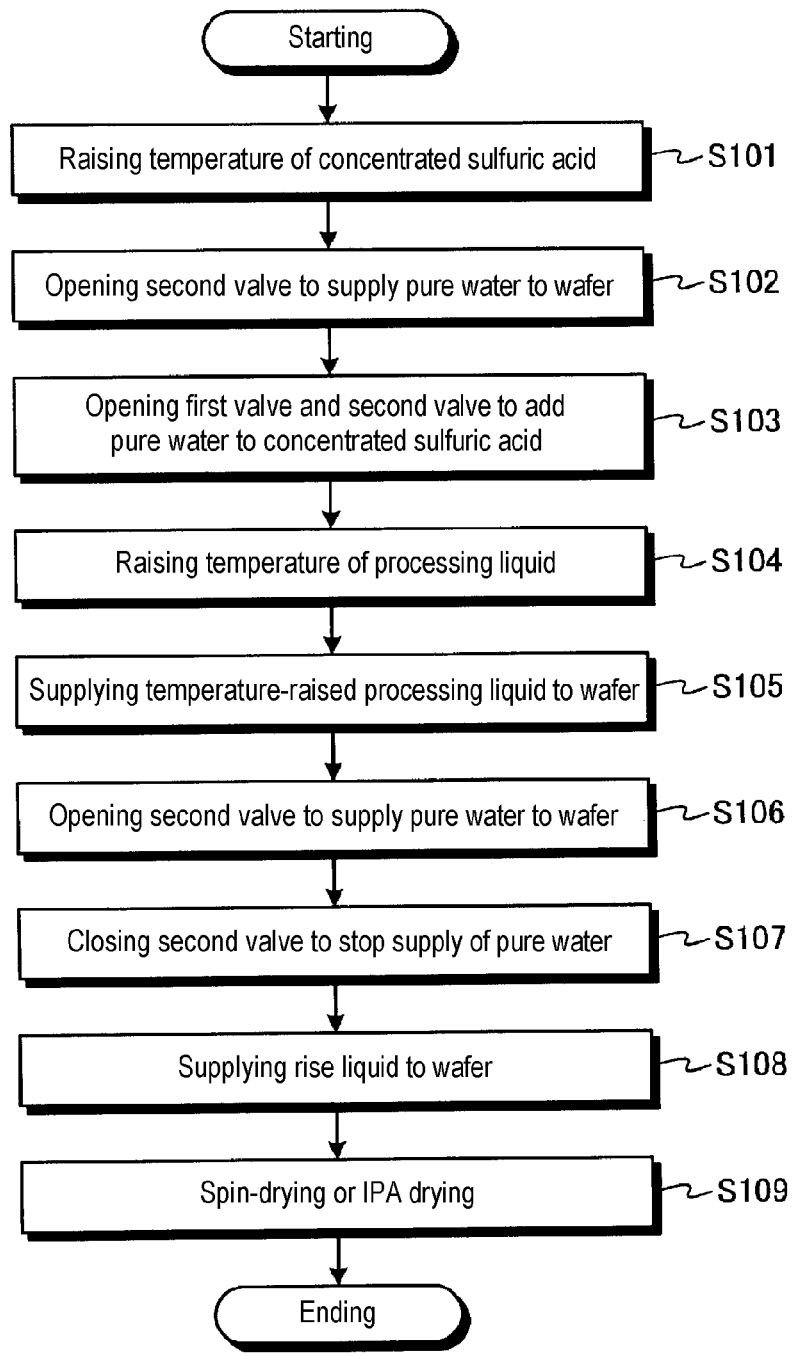
FIG. 10 is a flowchart illustrating a procedure of substrate processing executed by the substrate processing system according to an embodiment of the present disclosure.

Next, procedures of the substrate processing according to the present embodiment and the first modification will be described with reference to FIGS. 10 and 11. FIG. 10 is a flowchart illustrating a procedure of the substrate processing executed by the substrate processing system 1 according to the present embodiment.

First, the controller 18 controls the heater 107 of the concentrated sulfuric acid supply part 100 to raise the temperature of the concentrated sulfuric acid circulating in the circulation line 103 to a predetermined temperature (step S101). For example, the controller 18 raises the temperature of the concentrated sulfuric acid circulating in the circulation line 103 to about 120 degrees C.

Subsequently, the controller 18 opens the second valve 142 to supply the pure water from the pure water supply part 120 to the wafer W placed on the substrate processing part 30 (step S102), before etching is performed with the processing liquid L.

Thereafter, the controller 18 opens the first valve 141 and the second valve 142 and adds the pure water to the concentrated sulfuric acid at a predetermined ratio (step S103) to generate the processing liquid L. Then, the controller 18 raises the temperature of the processing liquid L to a predetermined temperature by using heat generated when the concentrated sulfuric acid and the pure water are mixed (step S104). For example, the controller 18 raises the temperature of the processing liquid L to about 150 degrees C.

Subsequently, the controller 18 controls the valve 44a to supply the temperature-raised processing liquid L to the wafer W (step S105), and etches the wafer W with the processing liquid L.

Then, once the etching process with the processing liquid L is completed, the controller 18 closes the first valve 141 and opens the second valve 142 to supply the pure water to the wafer W (step S106). Subsequently, the controller 18 closes the second valve 142 and the valve 44a to stop the supply of the pure water to the wafer W (step S107).

Subsequently, the controller 18 controls the valve 44b to supply a rinse liquid from the nozzle 41b to the wafer W (step S108). Then, the controller 18 controls the substrate processing part 30 to rotate the wafer W at high speed so that the rinse liquid is dropped from the wafer W to spin-dry the wafer W. Alternatively, in step S109, the rinse liquid may be substituted by IPA and the IPA may be dropped from the wafer W to IPA-dry the wafer W. Thereafter, the processing is completed.

Figure 11:
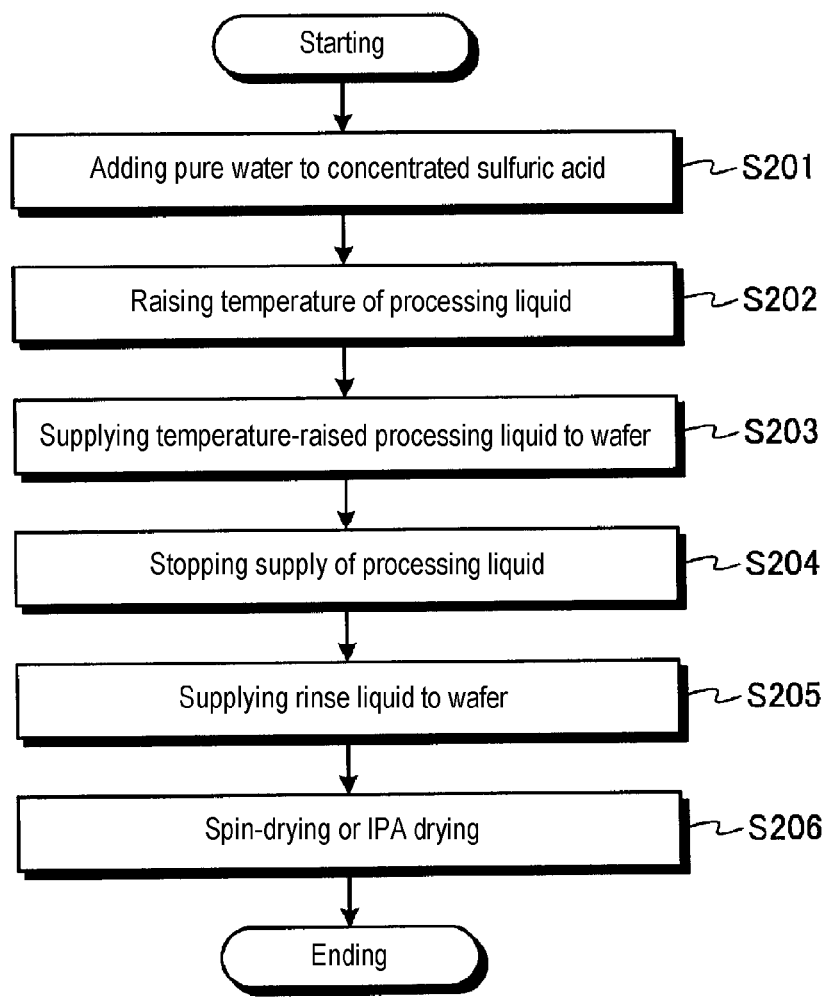
FIG. 11 is a flowchart illustrating a procedure of substrate processing executed by a substrate processing system according to the first modification of the present disclosure.

FIG. 11 is a flowchart illustrating a procedure of the substrate processing executed by the substrate processing system 1 according to the first modification of the present embodiment. First, the controller 18 controls the processing liquid supply part 60 to supply the concentrated sulfuric acid and the pure water to the addition part 140, which is a tank, thereby adding the pure water to the concentrated sulfuric acid (step S201) to generate the processing liquid L.

Subsequently, the controller 18 controls the heater 155 of the circulation line 151 to raise the temperature of the processing liquid L circulating in the circulation line 151 to a predetermined temperature (step S202). For example, the controller 18 raises the temperature of the processing liquid L to about 150 degrees C.

Subsequently, the controller 18 controls the switching part 157 and the valve 44a to supply the temperature-raised processing liquid L to the wafer W (step S203), and to etch the wafer W with the processing liquid L. Then, the controller 18 controls the valve 44a to stop the supply of the processing liquid L to the wafer W (step S204).

Subsequently, the controller 18 controls the valve 44b to supply the rinse liquid from the nozzle 41b to the wafer W (step S205). Then, the controller 18 controls the substrate processing part 30 to rotate the wafer W at high speed so that the rinse liquid is dropped from the wafer W to spin-dry the wafer W (step S206). Alternatively, in step S206, the rinse liquid may be substituted by IPA and the IPA may be dropped from the wafer W to IPA-dry the wafer W. Thereafter, the processing is completed.

The substrate treatment method according to an embodiment of the present disclosure includes temperature raising steps (steps S104 and S202) and liquid supply steps (steps S105 and S203). In the temperature raising steps, the temperature of the processing liquid L consisting of the concentrated sulfuric acid is increased. In the liquid supply steps, the temperature-raised processing liquid L is supplied to the substrate (wafer W) placed on the substrate processing part 30. Thus, it is possible to etch one of two kinds of materials contained in a film formed on the surface of the wafer W with high selectivity.

Furthermore, in the substrate treatment method according to the present embodiment, in the temperature raising steps (steps S104 and S202), the temperature of the processing liquid L is raised to 130 degrees C. or higher and a boiling point or lower. Thus, it is possible to etch titanium nitride out of tungsten and titanium nitride contained in the film formed on the surface of the wafer W with desired selectivity.

In addition, in the substrate treatment method according to the present embodiment, the processing liquid L does not contain hydrogen peroxide.

Furthermore, the substrate treatment method according to the present embodiment further includes pure water addition steps (steps S103 and S201) of adding the pure water to the processing liquid L. Thus, it is possible to improve the etching rate of the titanium nitride.

Furthermore, in the substrate treatment method according to the present embodiment, in the pure water addition steps (steps S103 and S201), the pure water is added so that the concentration of the sulfuric acid in the processing liquid L is 70 to 97% by mass. Thus, it is possible to etch titanium nitride out of tungsten and titanium nitride contained in the film formed on the surface of the wafer W with high selectivity.

Furthermore, the substrate treatment method according to the present embodiment includes a subsequent pure water supply step (step S106). After the liquid supply step (step S105), in the subsequent pure water supply step, the pure water added to the processing liquid L is supplied to the substrate (wafer W). Thus, it is possible to suppress the variation in the etching of the titanium nitride after etching is performed with the processing liquid L having a predetermined sulfuric acid concentration.

Furthermore, the substrate treatment method according to the present embodiment includes a preliminary pure water supply step (step S102). In the preliminary pure water supply step, the pure water added to the processing liquid L is supplied to the substrate (wafer W) before the liquid supply step (step S105). Thus, it is possible to suppress the variation in the etching of the titanium nitride before etching is performed with the processing liquid L having a predetermined sulfuric acid concentration.

Furthermore, in the substrate treatment method according to the present embodiment, a film containing tungsten is formed on the surface of the substrate (wafer W). Thus, it is possible to clean the wafer W with the processing liquid L without much etching the tungsten contained in the film on the surface of the wafer W.

Furthermore, in the substrate treatment method according to the present embodiment, a film containing tungsten or aluminum oxide and containing titanium nitride is formed on the surface of the substrate (wafer W). Thus, it is possible to etch the titanium nitride out of the tungsten or the aluminum oxide and the titanium nitride contained in the film formed on the surface of the wafer W with high selectivity.

Furthermore, in the substrate treatment method according to the present embodiment, the liquid supply steps (steps S105 and S203) include a step of removing residues on the substrate (wafer W) after dry etching or a CMP process.

Thus, it is possible to efficiently remove residues on the wafer W after the dry etching or the CMP process.

Although the embodiment of the present disclosure has been described above, the present disclosure is not limited to the aforementioned embodiments, but various modifications are possible without departing from the spirit of the present disclosure. For example, in the aforementioned embodiments, this technique may be applied not only to a step of etching one of a plurality of films formed on the substrate but also to a step of cleaning a substrate.

For example, when a tungsten film is formed on the substrate, the present disclosure may be applied to remove residues after the dry etching or after the chemical-mechanical polishing (CMP) process. Such an application example will be described below.

The substrate treatment method of the aforementioned embodiment was applied to the wafer W after the CMP process. In the CMP process in this example, ceria ($CeO_2$: cerium oxide) was used as a slurry, and after the CMP process, ceria residues (hereinafter, also referred to as "ceria slurry") remained on the wafer W.

First, diluted sulfuric acid (a sulfuric acid concentration of 92% by mass) at 150 degrees C. was supplied to the wafer W on which the ceria slurry remains. Then, after such processing with the diluted sulfuric acid, warm water (having a temperature of 70 degrees C.) was supplied to the wafer W for 60 seconds and then pure water at room temperature was supplied for 30 seconds for rinsing.

Furthermore, after such rinsing process, the wafer W was spin-dried (for 26 seconds), and the amount of removed ceria slurry on the wafer W was observed using inductively coupled plasma-mass spectrometry (ICP-MS). Experimental results are shown in Table 1.

TABLE 1

|  | Before liquid supply | After liquid supply | |
| --- | --- | --- | --- |
| Supply time of diluted sulfuric acid | — | 30 sec | 60 sec |
| Ceria slurry residues | 107.30 | 0.15 | 0.12 |
| (unit:*E + 10 atoms/$cm^2$) | 88.85 | 0.09 | — |

As shown in Table 1, it can be seen that the amount of residues of ceria slurry on the wafer W is significantly reduced by using the substrate treatment method of the aforementioned embodiment. That is, according to the present embodiment, it is possible to efficiently remove the residues on the wafer W after the dry etching or the CMP process.

Furthermore, in the aforementioned embodiment, there has been described the example in which the wafer W is etched with the processing liquid L and then rinsed, but the process after etching is not limited to the rinsing process, and any process may be performed.

For example, in the aforementioned embodiment, after the wafer W is etched with the processing liquid L, the temperature-controlled concentrated sulfuric acid may be supplied to the wafer W. By supplying the temperature-controlled concentrated sulfuric acid to the wafer W in this way, it is possible to remove air bubbles generated in the pipes by the dilute sulfuric acid contained in the processing liquid L.

It should be noted that the embodiments disclosed herein are exemplary in all respects and are not restrictive. The above-described embodiments may be omitted, replaced or modified in various forms without departing from the scope and spirit of the appended claims.

EXPLANATION OF REFERENCE NUMERALS

W: wafer, 1: substrate processing system (an example of substrate treatment device), 16: processing unit, 18: controller, 30: substrate processing part, 40: liquid supply part, 60: processing liquid supply part, 100: concentrated sulfuric acid supply part, 120: pure water supply part, 140: addition part, 141: first valve, 142: second valve

What is claimed is:

1. A substrate treatment method, comprising:
   a temperature raising step of raising a temperature of a processing liquid comprising 98% by mass of sulfuric acid, wherein in the temperature raising step, the temperature of the processing liquid comprising 98% by mass of sulfuric acid is raised to a temperature in a range of 130 degrees C. to a boiling point of the processing liquid comprising 98% by mass of sulfuric acid;
   a pure water addition step of adding pure water to the processing liquid of which the temperature is raised;
   a liquid supply step of supplying the processing liquid to which the pure water is added to a substrate placed on a substrate processing part via a nozzle, wherein the processing liquid supplied to the substrate in the liquid supply step selectively etches one of two kinds of materials contained in a film formed on the substrate; and
   a subsequent pure water supply step of supplying pure water to the substrate via the nozzle after the liquid supply step,
   wherein, in the pure water addition step, the temperature of the processing liquid is further raised.

2. The substrate treatment method of claim 1, wherein the processing liquid does not contain hydrogen peroxide.

3. The substrate treatment method of claim 1, wherein in the pure water addition step, the pure water is added so that the processing liquid comprises 70 to 97% by mass of sulfuric acid.

4. The substrate treatment method of claim 1, further comprising: a preliminary pure water supply step of supplying pure water to the substrate before the liquid supply step.

5. The substrate treatment method of claim 1, wherein the film contains tungsten.

6. The substrate treatment method of claim 1, wherein the film contains tungsten or aluminum oxide, and wherein the film contains titanium nitride.

7. The substrate treatment method of claim 1, wherein the liquid supply step includes a step of removing residues on the substrate after a dry etching or a CMP process.

* * * * *